(12) United States Patent
Elder et al.

(10) Patent No.: US 7,598,700 B2
(45) Date of Patent: Oct. 6, 2009

(54) TAMPER RESISTANT BATTERY AND BATTERY WARRANTY AND PERFORMANCE TRACKING SYSTEM

(75) Inventors: David Elder, Margate, FL (US); Frank Bruno, Lake Worth, FL (US)

(73) Assignee: Reserve Power Cell, LLC, Deerfield Beach, FL (US)

( * ) Notice: Subject to any disclaimer, the term of this patent is extended or adjusted under 35 U.S.C. 154(b) by 136 days.

(21) Appl. No.: 11/392,620

(22) Filed: Sep. 11, 2006

(65) Prior Publication Data

US 2007/0028020 A1 Feb. 1, 2007

Related U.S. Application Data

(60) Provisional application No. 60/666,309, filed on Mar. 30, 2005.

(51) Int. Cl.
- *H02J 7/00* (2006.01)
- *G01N 27/416* (2006.01)
- *G08B 21/00* (2006.01)

(52) U.S. Cl. .................. 320/106; 324/426; 324/434; 340/636.1; 340/636.12; 340/636.13; 340/636.15; 340/636.2

(58) Field of Classification Search .................. 320/106, 320/127; 324/425, 426, 429, 433, 434; 340/636.1, 340/636.12, 636.13, 636.15, 636.18, 636.2
See application file for complete search history.

(56) References Cited

U.S. PATENT DOCUMENTS

| | | | |
|---|---|---|---|
| 5,534,765 A | | 7/1996 | Kreisinger et al. |
| 5,606,242 A | | 2/1997 | Hull et al. |
| 5,666,040 A | * | 9/1997 | Bourbeau .................. 320/118 |
| 5,691,621 A | | 11/1997 | Phuoc et al. |
| 6,005,367 A | * | 12/1999 | Rohde ........................ 320/106 |
| 6,051,976 A | * | 4/2000 | Bertness .................... 324/426 |
| 6,072,299 A | | 6/2000 | Kurle et al. |
| 6,104,967 A | | 8/2000 | Hagen et al. |
| 6,291,966 B1 | | 9/2001 | Wendelrup et al. |
| 6,456,036 B1 | * | 9/2002 | Thandiwe ................... 320/106 |
| 6,784,637 B2 | | 8/2004 | Raichle et al. |
| 6,871,151 B2 | | 3/2005 | Bertness |
| 6,989,748 B2 | | 1/2006 | Rabanne et al. |

(Continued)

*Primary Examiner*—Akm E Ullah
*Assistant Examiner*—Richard V Muralidar
(74) *Attorney, Agent, or Firm*—Tangent Law Group; Eric J. Weierstall, Esq.; Daniel Crilly, Esq.

(57) ABSTRACT

A battery warranty and metrics tracking network with a programmable battery product for storing, sending and receiving data from a battery warranty, enablement, and metrics tracking network, having an at least one onboard electronics module and storage media on the battery product, an at least one point of sale/point of maintenance device providing communication with the battery product and communicating data from the battery product and to the battery product, an at least one network communicating data from the programmable battery product and to the programmable battery product and an at least one product warranty and features database in communication with the network, the database including storage of data from the programmable battery product and communication of stored data to the battery product to enable or disable the programmable battery product or enable or disable features on the battery product based on the information communicated to or from the programmable battery product or the at least one point of sale/point of maintenance device.

12 Claims, 2 Drawing Sheets

U.S. PATENT DOCUMENTS

| | | |
|---|---|---|
| 7,058,525 B2 * | 6/2006 | Bertness et al. ............... 702/63 |
| 7,129,706 B2 * | 10/2006 | Kalley ....................... 324/426 |
| 2001/0035732 A1 | 11/2001 | Sakakibara |
| 2002/0105443 A1 | 8/2002 | Flick |
| 2002/0125858 A1 | 9/2002 | Kuo et al. |
| 2002/0138772 A1 | 9/2002 | Crawford et al. |
| 2003/0137277 A1 | 7/2003 | Mori et al. |
| 2003/0169019 A1 | 9/2003 | Oosaki |
| 2003/0197512 A1 | 10/2003 | Miller et al. |
| 2005/0024061 A1 | 2/2005 | Cox et al. |
| 2005/0027466 A1 | 2/2005 | Steinmetz et al. |
| 2005/0038614 A1 | 2/2005 | Botts et al. |
| 2005/0134225 A1 | 6/2005 | Mese et al. |
| 2005/0149280 A1 | 7/2005 | Sharma et al. |
| 2005/0234663 A1 | 10/2005 | Quint et al. |
| 2006/0006876 A1 | 1/2006 | Bertness |

* cited by examiner

TAMPER RESISTANT BATTERY AND BATTERY WARRANTY AND PERFORMANCE TRACKING SYSTEM

CROSS-REFERENCE TO RELATED APPLICATIONS

This application claims the priority of U.S. provisional patent application 60/666,309, filed Mar. 30, 2005, which is incorporated herein by reference.

FIELD OF THE INVENTION

The invention relates to a method, article of manufacture, and a system for tracking and monitoring warranty and performance information for batteries, more specifically to a system including at least one of a database, a computer network, a point of sale/point of maintenance device, and an electronics package on a battery product working to store information on the battery and extract information from the battery.

BACKGROUND OF THE INVENTION

The automotive industry has been one of the leading innovators in the world throughout the last hundred years. As a leader in advanced technologies, automakers have consistently incorporated state of the art technology into the vehicles we drive. From the analog world of the early twentieth century, the automobiles of today have increasingly incorporated high technology electronics to provide enhanced functionality, ease of use, and ease of maintenance.

However, current battery technologies have lagged far behind this modernization curve. Little impetus has been provided to improve battery technologies beyond advancing some of the chemistry and physical properties within the battery. Nonetheless, as the myriad of technological advances have been incorporated into automobiles, the need for reliable electrical power has also increased—and the battery remains at the heart of providing that power. To supply that power in a more reliable fashion, innovative smart batteries and smart multiple battery systems have been or are being developed by automakers and battery manufacturers alike.

Devices like U.S. Patent Application Number 2005/0038614 Botts et al. shows a remote battery monitoring system and sensors in which a plurality of telesensors are connected to batteries in a battery string. The telesensors measure battery data such as voltage, current, and temperature and wirelessly transmit the battery data to a control and collection unit. The control and collection unit receives, processes, analyzes, and stores the battery data. Remote monitoring software running on the control and collection unit can be configured to provide warning alarms when the battery data is outside present limits.

Another example is U.S. Pat. No. 6,456,036 to Thandiwe, which provides for a smart battery that has a network communication interface such that the battery can send and receive battery-related data. The battery is in conductive and communicative interface with a device, such as a cellular telephone, personal digital assistant (PDA), or laptop computer, which has a network communication pathway that the battery uses for data exchange. The smart battery can alternately be in conductive and communicative interface with a charger that is interfaced with a computer, and the charger selectively establishes a network communication pathway through the charger-computer interface for the smart battery to exchange data across the network. However, the system does not provide for the communication of information exchanged with the network to include storage of battery historic information, such as warranty activation/validation data and/or warranty invalidating performance information, or for the selective enablement of the battery or features of or on the battery.

Similarly, U.S. Patent Application Publication Number 2003/0197512 to Miller et al. shows a battery analyzer configured to communicatively couple to a computer network in which a processing arrangement is configured to charge and discharge the battery of each of an at least one battery arrangement via a battery interface arrangement and is configured to initiate a performance sequence. Data communication between the battery analyzer and a customer service site is illustrated in and can include for example, usage, performance, and/or technical support information of the battery arrangement to the customer service site via the computer network. The centralized computer system may store the information in a memory unit for subsequent retrieval, for example, to graph the usage and performance information and/or to perform numerical analysis on the usage and performance information. However, again, no warranty information is stored, treated, or communicated between the battery analyzer of Miller, et al., nor is there any discussion of the enablement or selective activation or deactivation of features on or in the battery.

In addition, several testers have been developed that provide for communication of battery data to remote locations. For instance, U.S. Pat. No. 6,871,151 to Bertness shows an electronic battery tester for testing a storage battery including test circuitry configured to provide a battery test output related to a condition of the battery. A memory stores an address of the battery tester, and communication circuitry transmits the battery test output formatted with the battery tester address on a communication link to a remote location. Likewise, U.S. Pat. No. 6,784,637 to Raichle et al. shows a method and apparatus that allows a battery charger/tester to store and retrieve information from a storage media. Information, such as the result of the charge and testing of the battery, can be stored on the storage media. Additionally, information, such as firmware updates, can be uploaded from the storage media. And again, U.S. Patent Application Publication Number 2006/0006876 shows an electronic battery tester and method that includes generating battery test data from an electronic battery test. The battery test data is transmitted over a wireless communication medium. In another aspect, a method and apparatus is provided for receiving battery test data from a wireless communication medium. Also, a diagnostic battery charger is also provided, which is capable of transmitting battery condition information to an external receiver. Yet still, no specific discussion of warranty information is suggested in any of these references as being transmitted and stored for tracking warranty related claims, nor is there any discussion of selective activation or deactivation of features on or in the battery.

These improved technologies come with every increasing costs to both the customer and the manufacturer. As the batteries become more advanced, the replacement costs for meeting warranty obligations for manufacturers increases. Moreover, the cost of recalls and failures in designs that might reduce battery life make this replacement cost even greater. Additionally, smart batteries will increasingly provide a wider and wider range of functionality and become more feature rich. A system for providing control over the software and hardware enablement of the batteries is needed.

Therefore, there exists a need to provide a system whereby information can be programmed into a smart battery and this information can be centrally stored for use by maintenance providers and manufacturers.

There exists a further need to provide an onboard programmable component of a smart battery that is capable of both receiving data at point of sale and receiving data at point of maintenance while also allowing for communication of this data to a centralized data network. Additionally, in receiving this data, the smart battery must be capable of disabling and/or enabling both software and hardware on the battery.

SUMMARY OF THE INVENTION

An object of the invention is to provide a smart battery together with a warranty and metrics tracking system whereby information can be programmed into a smart battery and, at the same time, that information can be centrally stored for use by maintenance providers and manufacturers.

An object of the invention is to an onboard programmable component of a smart battery that is capable of both receiving data at point of sale and receiving data at point of maintenance while also allowing for communication of this data to a centralized data network. Additionally, in receiving this data, the smart battery must be capable of disabling and/or enabling both software and hardware on the battery.

The invention includes an article of manufacture, an apparatus, a method for making the article, and a method for using the article.

The system of the invention includes a computer system including a computer-readable medium having software to operate a computer in accordance with the invention.

Still further, the article of manufacture of the present invention comprises a computer-readable medium embodying a computer program. For the present invention, the computer-readable medium embodying the computer program comprises program modules to control a computer to perform the method of the present invention.

Further, the apparatus of the present invention comprises a computer programmed with software to operate the computer in accordance with the present invention.

Additionally, the apparatus of the present invention includes a tamper resistant battery and electronics module.

Moreover, the above objects and advantages of the invention are illustrative, and not exhaustive, of those that can be achieved by the invention. Thus, these and other objects and advantages of the invention will be apparent from the description herein, both as embodied herein and as modified in view of any variations that will be apparent to those skilled in the art.

BRIEF DESCRIPTION OF THE DRAWINGS

Embodiments of the invention are explained in greater detail by way of the drawings, where the same reference numerals refer to the same features.

DETAILED DESCRIPTION OF THE INVENTION

Figure 1:
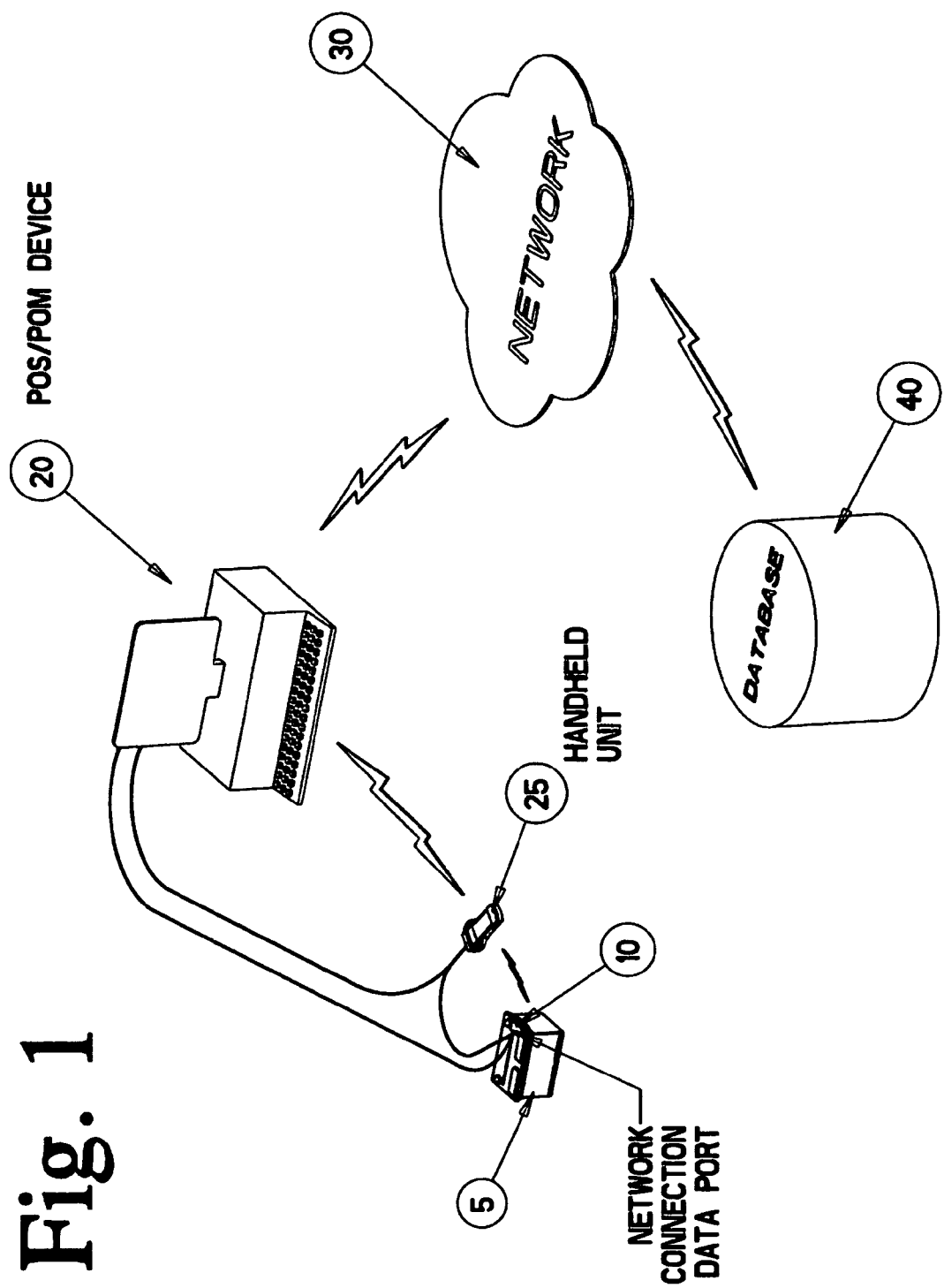
FIG. 1 illustrates a plan view of the instant invention.

In describing the invention, the following definitions are applicable throughout.

A "computer" refers to any apparatus that is capable of accepting a structured input, processing the structured input according to prescribed rules, and producing results of the processing as output. Examples of a computer include: a computer; a general purpose computer; a supercomputer; a mainframe; a super mini-computer; a mini-computer; a workstation; a micro-computer; a server; an interactive television; a hybrid combination of a computer and an interactive television; a controller processor; an ASIC; and application-specific hardware to emulate a computer and/or software. A computer can have a single processor or multiple processors, which can operate in parallel and/or not in parallel. A computer also refers to two or more computers connected together via a network for transmitting or receiving information between the computers. An example of such a computer includes a distributed computer system for processing information via computers linked by a network.

A "computer-readable medium" refers to any storage device used for storing data accessible by a computer. Examples of a computer-readable medium include: a magnetic hard disk; a floppy disk; an optical disk, such as a CD-ROM and a DVD; a magnetic tape; a memory chip; and a carrier wave used to carry computer-readable electronic data, such as those used in transmitting and receiving e-mail or in accessing a network, such as the Internet or a local area network ("LAN"); and any storage device used for storing data accessible by a computer.

A "computer system" refers to a system having a computer, where the computer comprises at least one computer and a computer-readable medium embodying software to operate the computer.

A "database" is a combination of software and hardware used to efficiently store data on an at least one information storage device, in an exemplary embodiment this includes storage on an information storage device comprising an at least one computer readable medium as defined herein.

A "handheld device" is a handheld device capable of receiving and processing data in a manner emulating a computer as defined herein.

An "information storage device" refers to an article of manufacture used to store information. An information storage device has different forms, for example, paper form and electronic form. In paper form, the information storage device includes paper printed with the information. In electronic form, the information storage device includes a computer-readable medium storing the information as software, for example, as data.

A "network" refers to a number of computers and associated devices that are connected by communication facilities. A network involves permanent connections such as cables or temporary connections such as those made through telephone or other communication links. In this way the network can be maintained by conventional wires or may also be provided wirelessly. Examples of a network include: an internet, such as the Internet; an intranet; a local area network (LAN); a wide area network (WAN); CAN and LIN networks; cellular networks; and any combination of networks, such as an internet and an intranet.

A "point of sale/point of maintenance device" refers to a network interface, a computer or handheld device that is used to interface with a network, a database, and/or with the electronics module of the battery product. This may be a single device or may be comprised of numerous component devices, such as a handheld device used in conjunction with a wireless network connection to a computer which then communicates with a network and, thereby, a database. The point of sale/point of maintenance device is located at the point of sale or point of maintenance and is coupled to the battery product.

"Software" refers to prescribed rules to operate a computer or similar device. Examples of software include: software;

code segments; program modules; instructions; computer programs; and programmed logic.

FIG. 1 shows a plan view of the instant invention. The instant invention is directed to a battery warranty and metrics tracking network with a programmable battery product also capable of storing performance data. The components of the system include at least one of an onboard electronics module 10 on the battery product 5; a point of sale/point of maintenance device 20 which provides communication with the battery product 5 and a data input for communicating data from and into the battery 25 and also communication of this data to a product database 40; and a network 30 carrying relevant data for storage in the product database 40 and data and/or instructions 50 for storage on the battery product 5 and within the database 40. Reference to a network, a database, an information storage device, a point of sale/point of maintenance device, and an electronics module is to be read as including at least one of each device that is reference to the singular includes all derivations of the plural for each feature disclosed.

The electronics module 10, the point of sale/point of maintenance device 20, network 30, and database 40 further includes at least one computer-readable medium in an information storage device embodying software for implementing the invention and/or software to operate the electronics module 10, the point of sale/point of maintenance device 20, the network 30, and database 40 in accordance with the invention. In an exemplary embodiment, the point of sale/point of maintenance device 20 would operate as a distributed network connected to servers for data storage and retrieval nationwide.

Figure 2:
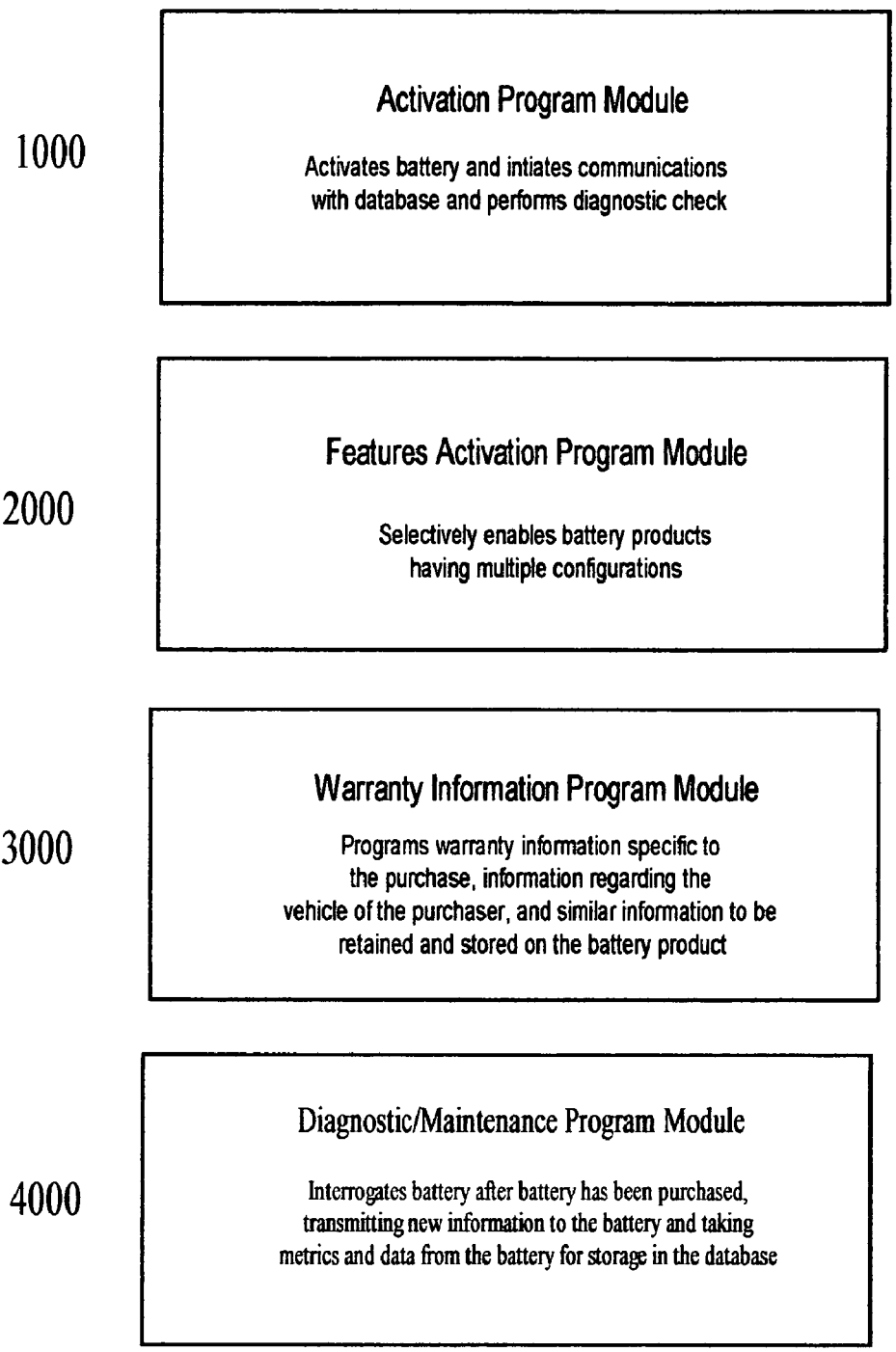
FIG. 2 illustrates the program modules of an exemplary embodiment of the instant invention.

FIG. 2 shows a flow chart of the program modules used in the invention. In a first program module 1000, software for activating the battery product 5 is provided via the instant invention from the database 40 through the point of sale/point of maintenance device. The system allows for programming, activation, and configuration of the battery product 5. The battery product 5 may be any battery capable of accommodating the electronics module 10. In an exemplary embodiment the battery product 5 is a smart battery or multiple battery system having an at least one electronics module 10 thereon. The electronics module 10 maintains the battery product in dormant state. The battery is only awoken from the dormant state by interaction with the point of sale/point of maintenance device 20.

Effectively the instant invention provides a warranty of non-use of the battery product 5 up to the point of sale, as the battery product 5 is only activated at this time. In an exemplary embodiment, this is accomplished with a point of sale/point of maintenance handheld device 22. The battery product activates at the time of sale as software is pushed from the handheld into the electronics module 5 of the battery warranty and metrics tracking system.

A further program module 2000 provides for activation of additional programmable capabilities on the battery product 5. In instances where the battery product 5 has multiple programmable configurations, the specific configuration can be activated via the point of sale/point of maintenance device 20. Software is pushed into the electronic package 5 and relevant hardware components and accessory function onboard the battery can be selectively enabled based on this software. One example of such a multiple configuration intelligent battery system or programmable battery product is applicant's INTELLICELL battery system, which can be configured for multiple feature levels as well as vehicle and geographic specific functionality. These can include, for example, but certainly are not limited to, activating specific feature rich hardware onboard the intelligent battery system, such as, but certainly not limited to, the hardware indicated in applicants co-pending U.S. patent applications Ser. Nos. 10/604,703, 10/708,739 and 10/913,334, herein incorporated by reference.

Together with the software being pushed onto the battery product, in a further program module 3000, warranty information specific to the purchaser, information regarding the vehicle of the purchaser, and similar information may be retained and stored on the battery product 5 and, through the network 30, within the database 40. In an exemplary embodiment, the point of sale/point of maintenance device 20 is used to enter data into the battery product 5. The data can include, for example, identifying information for the specific battery product 5, including for instance, but certainly not limited too, the point of purchase, the date of purchase, a level of warranty, a time period of warranty, vehicle identifying information such as VIN number, vehicle make and model information, locale and geographic specific information, regional information, vehicle specific/manufacturer specific information, and other relevant information. This information, in portions or in its entirety, is stored on the battery product 5 and within the database 40.

The information is pushed to the battery product 5 regarding the point of sale/warranty data and communicated, either at the time of purchase or at a later time, to the battery warranty and metrics tracking system network allowing for the storage of battery product 5 specific data into the battery product 5 and into the database 40. The network component 30 of the battery warranty and metrics tracking system transmits this data and allows for storage of this data in the database 40 as a database of product and customer information.

In a further program module 4000, the point of sale/point of maintenance device 20 is used during maintenance or at a location where the battery product 5 is being returned to interrogate the information regarding the warranty stored in the electronics module 10. This information may be compared to the stored data within the database 40. Additionally, performance data from the battery product 5 may be retrieved and transmitted via the network to the database 40. This can include metrics regarding any of the characteristics of the battery, including voltage, amps, temperature, and similar characteristics as well as vehicle data communicated from the vehicle to the battery and event specific data that is stored based on previously stored event parameter data pushed onto the battery product 5.

The program modules function together to provide tracking of specific information about individual battery products. Each module can function independently of the others and there is no specific order of operation, however, in an exemplary embodiment of the instant invention the software embodying the invention is loaded throughout the network 30 into the point of sale/point of maintenance devices 20. During the initial sale of the battery product, the first program module or activation module 1000 is activated through the point of sale/point of maintenance device 20 to program the battery product 5. The battery product 5 is activated by the point of sale/point of maintenance device 20 activating the electronic module 10, which runs a diagnostic check of the battery and then allows for entry of sales specific programming, activation, and configuration information for the battery product 5. The activation module 1000 looks for software updates, which can be pushed from the database 40 to the point of sale/point of maintenance devices 20 for installation of the latest software in the battery product 5. Likewise, the information stored on the battery product 5 is sent back to the database 40 through the point of sale/point of maintenance device 20 and the network 30 in a further step, through activation of the warranty information module 3000 as described herein below.

If appropriate, the second program module or features activation program module 2000 is activated. This module allows the point of sale/point of maintenance device 20 to selectively enable battery products 5 having multiple configurations. Depending on the desired accessories and features in the particular configuration, the battery product 5 through electronics module 10 enables the features and accessories of the particular configuration. Additional installation procedures my be required and these are noted at the point of sale/point of maintenance device 20.

After activation and initial diagnostics, a third program or warranty information program module 3000 programs warranty information specific to the purchase, information regarding the vehicle of the purchaser, and similar information to be retained and stored on the battery product 5. This information is similarly communicated through the network 30 back to the database 40. In this exemplary embodiment, the point of sale/point of maintenance device 20 is used to enter data into the battery product 5. This can be accomplished via any input device, non-limiting examples being a keyboard or touch screen. The data can include, for example, identifying information for the specific battery product 5, including for instance, but certainly not limited to, identification of the point of sale, the date of purchase, a level of warranty, a time period of warranty, vehicle identifying information such as VIN number, vehicle make and model information, locale and geographic specific information, regional information, vehicle specific/manufacturer specific information, and other relevant information. This information, in portions or in its entirety, is stored on the battery product 5 and within the database 40. The information is pushed onto the battery product 5 regarding the point of sale/warranty data and this information is then communicated, either at the time of purchase or at a later time, to the battery warranty and metrics tracking system network allowing for the storage in the database 40.

After activation and programming, the battery is fully functional and operated by the purchaser. During maintenance calls or if the battery product 5 is returned for warranty purposes, the fourth or diagnostic program module 4000 can be activated. The diagnostic module can also be used at the point of sale, if further diagnostic information is desired. The diagnostic program module is run through the point of sale/point of maintenance device 20 and communicates with the electronics module 10 of the battery through a wireless or standard wired connection (note the data port). The information obtained from the battery product 5 will report all previously stored information on the battery product 5. This information can be checked, if desired, against the records stored in database 40. Further, information collected on the battery products 5 metrics can include historical data, especially in the case of failure. This could include operational metrics and information regarding the past and current state of the battery, and this and other stored information can be retrieved. This information is communicated to the database 40 and added to the record of the battery product 5 stored thereon. Additionally, software upgrades and other relevant new information is then transmitted back to the battery product 5 from the database 40 through the network 30 and the point of sale/point of maintenance device 20. The information on the battery product 5 is thus maintained and a record of the performance of the battery product 5 and its service history are recorded.

This data warehousing on the database 40 provides manufacturers and distributors with heretofore unknown tracking and metrics capabilities. The data warehousing within the battery warranty and metrics tracking system allows distributors and manufacturers to analyze the data fields in the database 40 and make determinations and correlations regarding battery costs and performance and thereby adjust warranties accordingly. The data warehousing also enables faster recall notifications for potential service issues. Additionally, the data enables manufacturers to more clearly fit and enforce warranties based on regional zones and provides enhanced tracking for warranty claims, including data on metrics. This metrics tracking would provide for faster improvements in designs based on this data. For example, if warranty hits increased or maintenance data showed increased failures in cold weather regions, battery design could more efficiently be adjusted to improve cold weather performance.

In addition to the software, computers and networks comprising the tracking system, the electronics module 5 of the instant invention provides additional security in providing accurate data on warranties. Current process of date stamping the exterior is a thing of the past. Tampering with date stamping currently used for warranty tracking and management is easily accomplished in the current market. This leads to an increased numbers of fraudulent warranty claims. The electronics module 10 of the instant invention is developed in such a manner as to deter removal and/or tampering with this component. This is done to both prevent modification of the onboard data pushed onto the battery product and to prevent remanufacture/rehabilitation of the electronics module by unauthorized manufacturers. The methodology of rendering the electronics module tamper resistant can include, but are not limited to, electronics, tamper-resistant/evident markers, mechanical tamper indicators, tamper resistant software functionality (e.g. searching for an electrical connection or otherwise search for point of sale/point of maintenance device), firmware, or similar methodologies to deter tampering. The battery product 5 may, if tampered with, be disabled or an indicator may be provided to alert customers and maintenance personnel.

In an exemplary embodiment, the functionality of the battery product 5 would be disabled; however, access to and the integrity of the stored data will be maintained and accessible via the point of sale/point of maintenance device 20 of the instant invention. The point of sale/point of maintenance device 20 will be able to access the data from the battery product 5, either directly from the electronic module 10 or from component parts, such as, but not limited to, a secure E-PROM chip, of the electronics module 10.

The embodiments and examples discussed herein are non-limiting examples. The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A battery warranty, enablement and metrics tracking system operable to communicate over a network, the system comprising:
   a programmable battery product including at least one onboard electronics module and storage media;
   at least one point of sale/point of maintenance device communicating data to and from the programmable battery product and providing communication with the network; and
   at least one product warranty and features database in communication with the network, the database storing data from the programmable battery product and communicating stored data to the programmable battery product over the network to enable or disable the programmable battery product or to enable or disable features on the programmable battery product based on information communicated to or from at least one of the programmable battery product and the at least one point of sale/point of maintenance device wherein the programmable battery product is initialized for use after initial communication with the at least one point of sale/point of maintenance device.

2. The battery warranty, enablement, and metrics tracking system of claim 1, wherein the initial communication with the at least one point of sale/point of maintenance device activates the programmable battery product only after software is pushed from the network onto the programmable battery product.

3. The battery warranty, enablement, and metrics tracking system of claim 2, wherein the software pushed from the network enables specific programmable features of the programmable battery product.

4. The battery warranty, enablement, and metrics tracking system of claim 2, wherein the software pushed from the network enables at least one hardware feature on the programmable battery product.

5. The battery warranty, enablement, and metrics tracking system of claim 1, wherein the at least one product warranty and features database further stores warranty data for the programmable battery product.

6. The battery warranty, enablement, and metrics tracking system of claim 5, wherein the storage media of the programmable battery product further stores the warranty data.

7. The battery warranty, enablement, and metrics tracking system of claim 5, wherein the warranty data includes at least one of: data specific to a purchaser of the programmable battery product, data information regarding a vehicle, data identifying information for the programmable battery product, information related to a point of purchase of the programmable battery product, information related to a date of purchase of the programmable battery product, information regarding a level of warranty for the programmable battery product, information regarding a time period of warranty for the programmable battery product, vehicle identifying information, a VIN number, vehicle make and model information, geographic information, and vehicle specific/manufacturer specific information.

8. The battery warranty, enablement, and metrics tracking system of claim 1, wherein the at least one point of sale/point of maintenance device is further used to enter data into the programmable battery product.

9. The battery warranty, enablement, and metrics tracking system of claim 1, wherein the point of sale/point of maintenance device is further used during at least one of maintenance and processing of a return of the programmable battery product to interrogate the data stored in the at least one product warranty and features database or data stored in the programmable battery product.

10. The battery warranty, enablement, and metrics tracking system of claim 9, wherein the storage media further stores performance data for the programmable battery product, and wherein the performance data is retrieved and transmitted via the network to the at least one product warranty and features database.

11. The battery warranty, enablement, and metrics tracking system of claim 10, wherein the performance data includes voltage, current, temperature, vehicle data communicated from a vehicle containing the programmable battery product to the programmable battery product, and event specific data.

12. The battery warranty, enablement, and metrics tracking system of claim 11, wherein the event specific data is based on event parameter data previously stored in the storage media.

* * * * *